United States Patent [19]

Ohtsuki

[11] Patent Number: 4,780,793
[45] Date of Patent: Oct. 25, 1988

[54] IC CARD AND CONNECTOR THEREFOR

[75] Inventor: Tomonari Ohtsuki, Mooka, Japan

[73] Assignee: Daiichi Denshi Kogyo Kabushiki Kaisha, Japan

[21] Appl. No.: 55,133

[22] Filed: May 28, 1987

[30] Foreign Application Priority Data

| Jun. 3, 1986 | [JP] | Japan | 61-128693 |
| Oct. 24, 1986 | [JP] | Japan | 61-253276 |
| Dec. 27, 1986 | [JP] | Japan | 61-312422 |
| Dec. 27, 1986 | [JP] | Japan | 61-315159 |
| Apr. 8, 1987 | [JP] | Japan | 62-86190 |

[51] Int. Cl.$^4$ .................. H05K 1/14; H01R 13/453
[52] U.S. Cl. .................. 361/399; 361/394; 361/395; 361/413; 235/492; 439/136; 439/137
[58] Field of Search .............. 235/492; 439/131, 137, 439/140, 892; 361/392, 394, 395, 399, 415, 413; 200/50 A; 220/340

[56] References Cited

U.S. PATENT DOCUMENTS

| 4,592,608 | 6/1986 | Ohtsuka et al. | 439/140 |
| 4,600,257 | 7/1986 | Fushimoto | 439/137 |
| 4,695,925 | 9/1987 | Kodai | 361/95 |

Primary Examiner—A. D. Pellinen
Assistant Examiner—Leon K. Fuller
Attorney, Agent, or Firm—Silverman, Cass, Singer & Winburn, Ltd.

[57] ABSTRACT

A shuttered card-edge type IC card including a base having springs therein and a circuit board, a shutter and a cover provided in succession on at least one surface of the base. The base is formed with guide grooves and guide and spring receiving grooves. The springs are located in the guide and spring receiving grooves to close the shutter. The shutter is provided with pawls to be fitted in the guide grooves, respectively, for guiding the pawls in the guide grooves. The shutter is further provided with spring bias plates to be fitted in the guide and spring receiving grooves, respectively, for guiding the spring bias plates in the guide and spring receiving grooves and biasing the spring bias plates by the springs located therein. The connector comprises ridges located corresponding to the guide grooves of the base of the IC card and to be fitted in the guide grooves. The shutter of this IC card is not easily opened even if any member contacts the card in carrying or using it. Terminals of the IC card are securely in contact with contacts of the connector when the card is inserted into the connector of an electric computer.

13 Claims, 15 Drawing Sheets

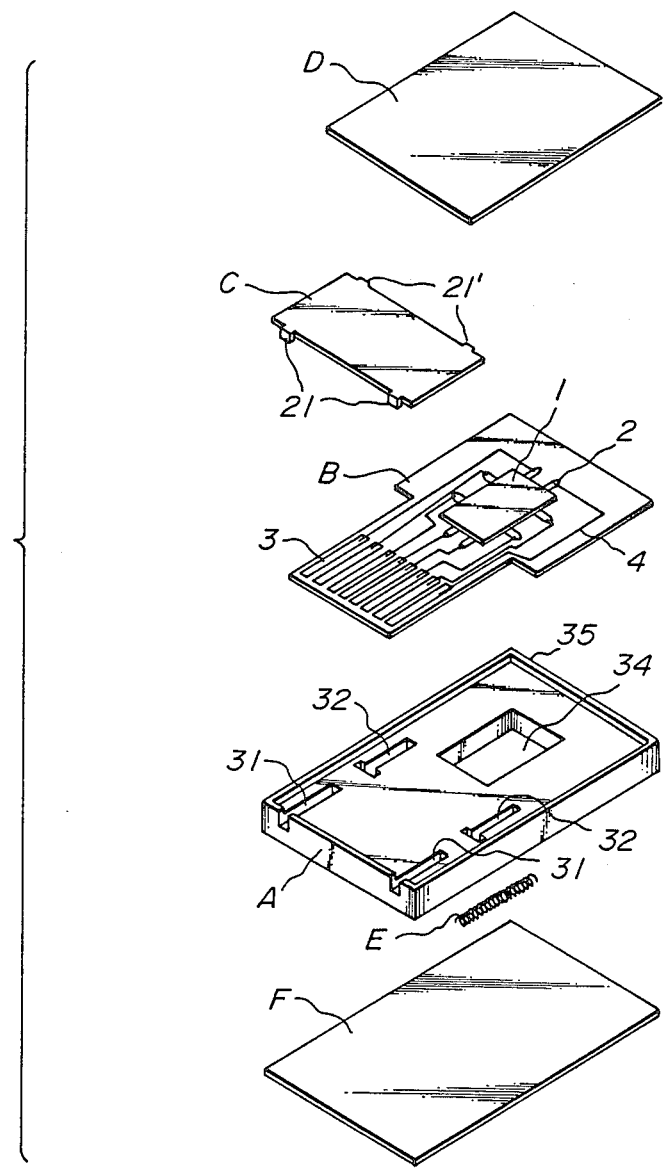

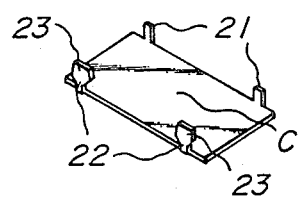
FIG_3
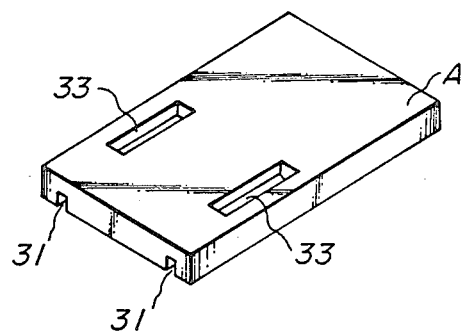
FIG_4
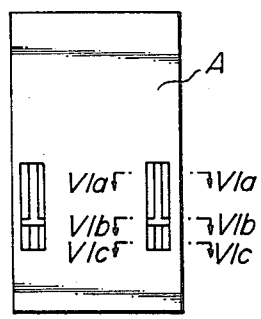
FIG_5
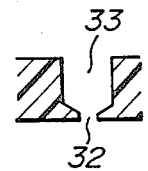
FIG_6a
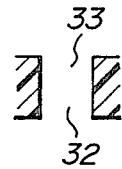
FIG_6b
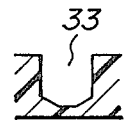
FIG_6c

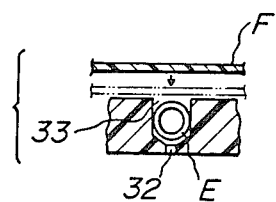
FIG_7
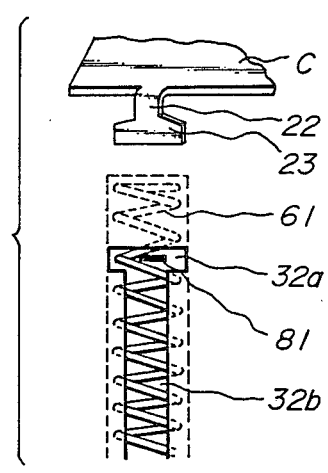
FIG_8
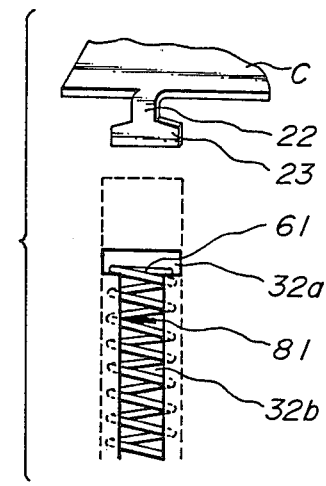
FIG_9

FIG_10a
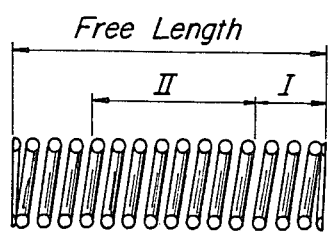
FIG_10b
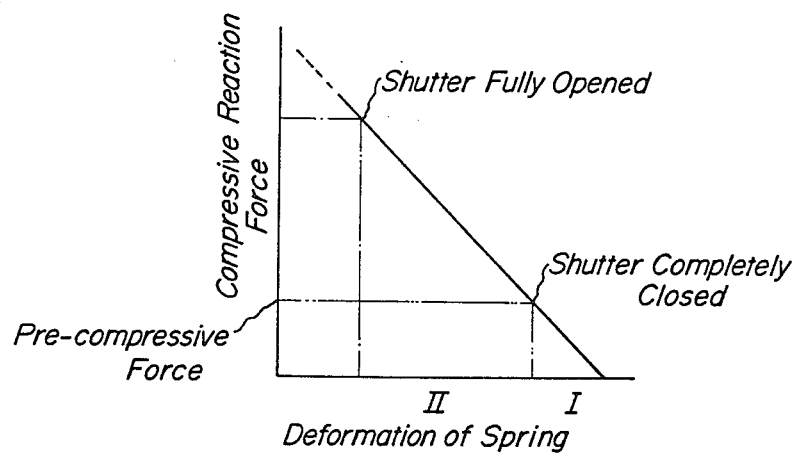

FIG_11a
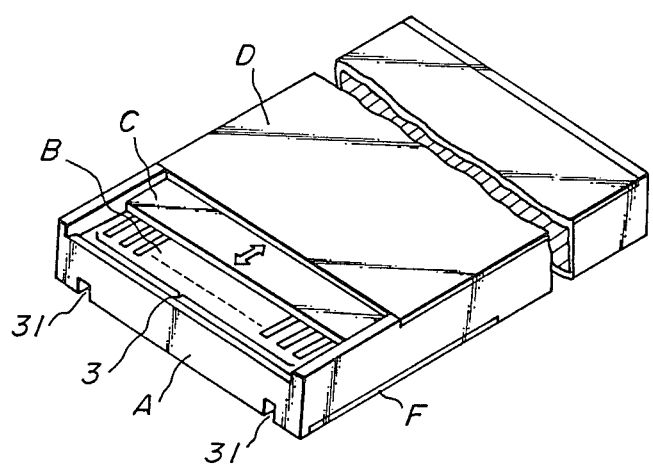

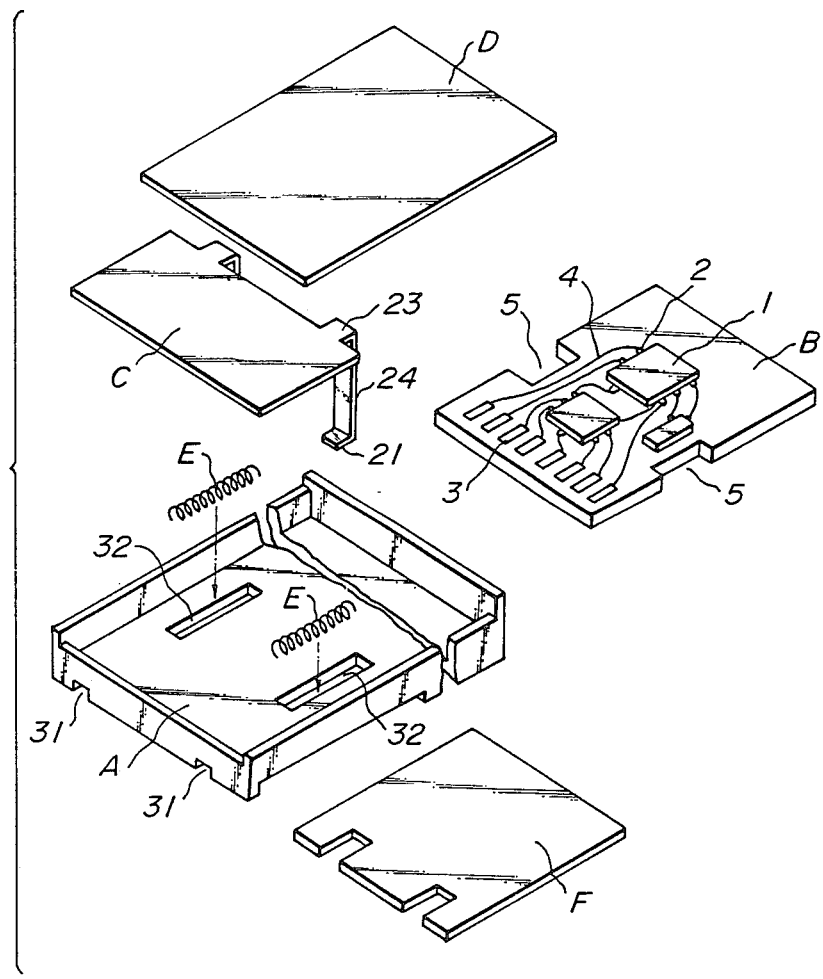
FIG_11b

FIG_12a
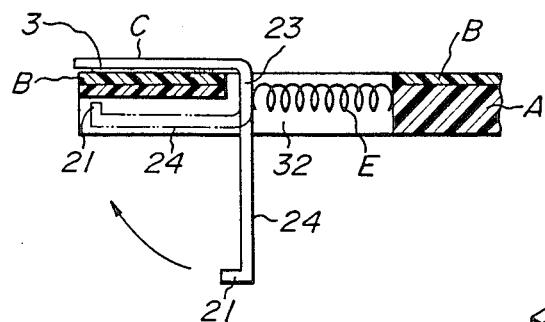
FIG_12b
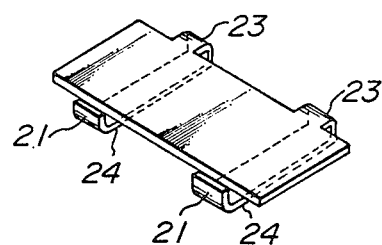
FIG_13a
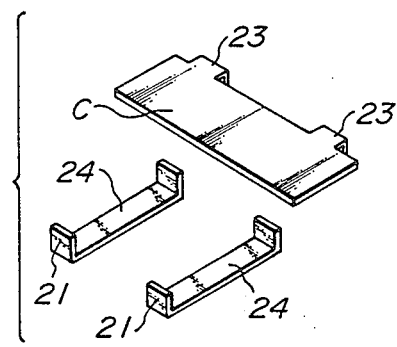
FIG_13b
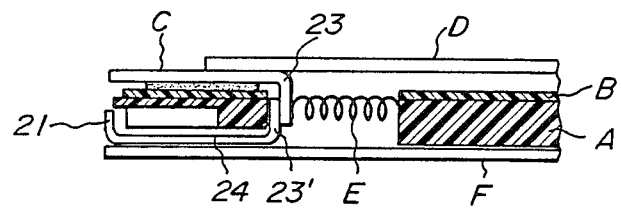

FIG_16a
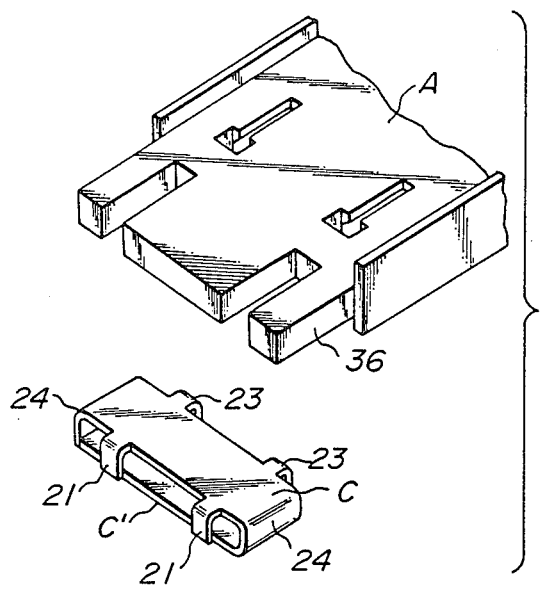
FIG_16c
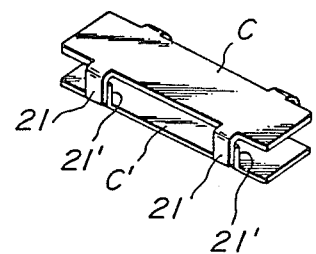
FIG_16b
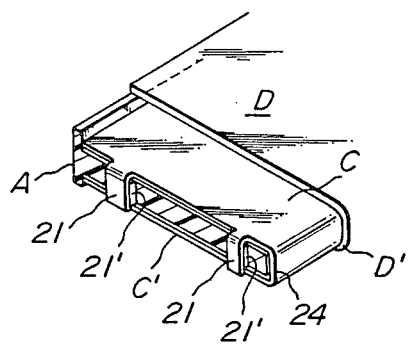
FIG_16d
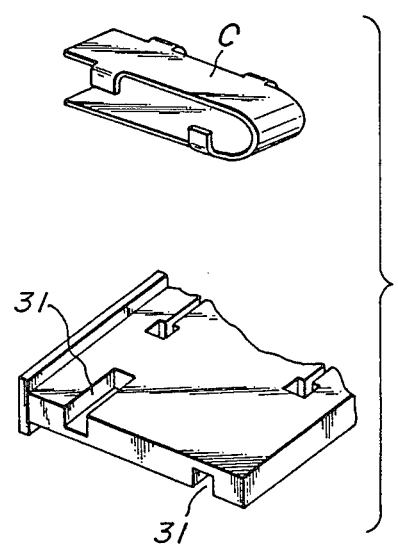

FIG_17a
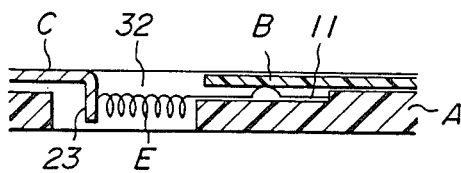
FIG_17b-1
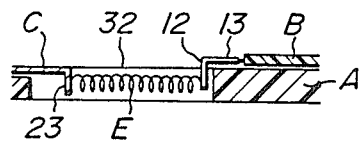
FIG_17b-2
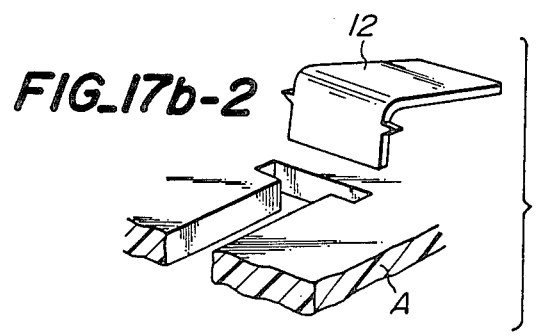
FIG_17c
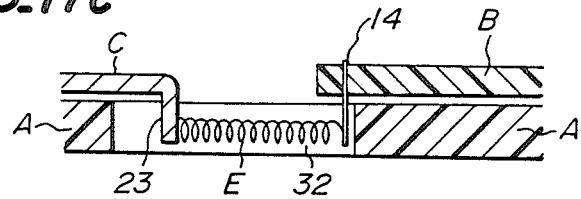
FIG_17d
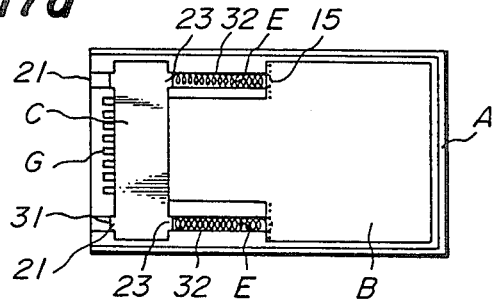

FIG_18b
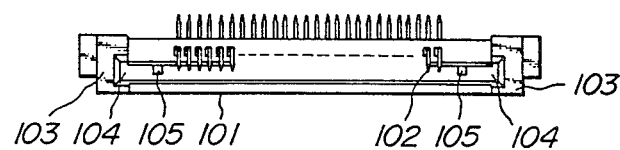
FIG_18a
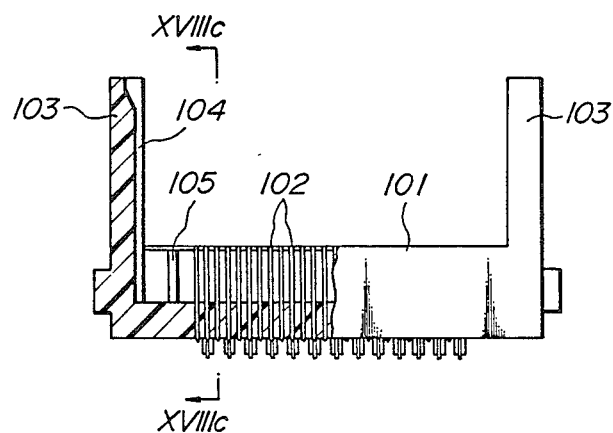
FIG_18c
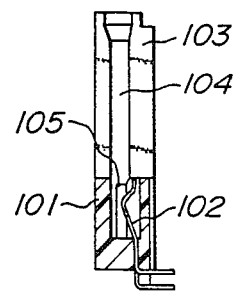

FIG_19b
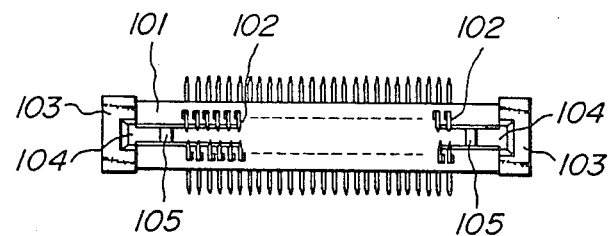
FIG_19a
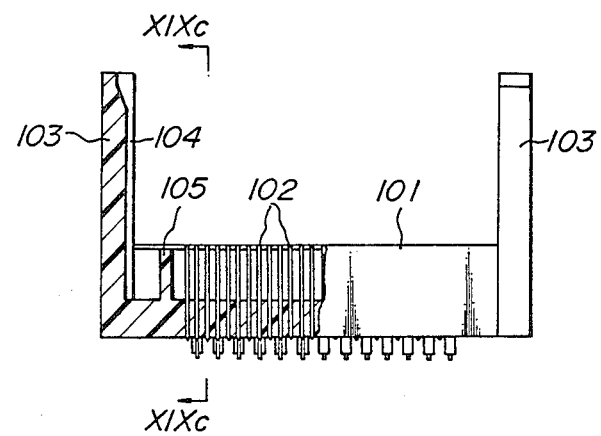
FIG_19c
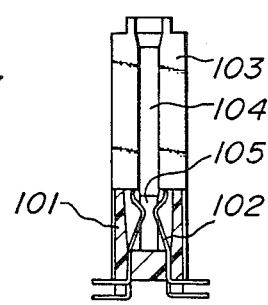

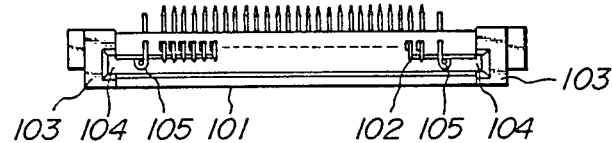
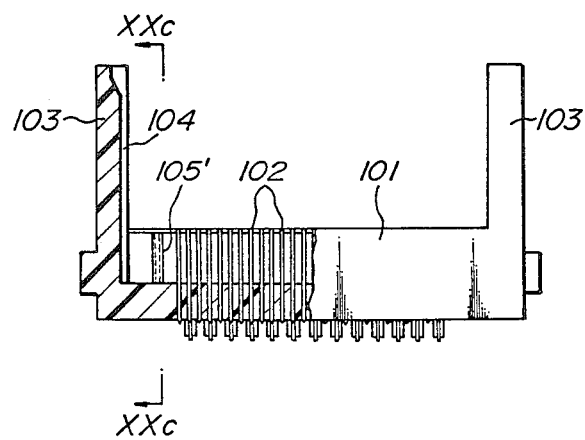 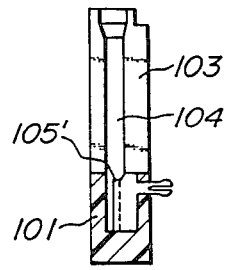
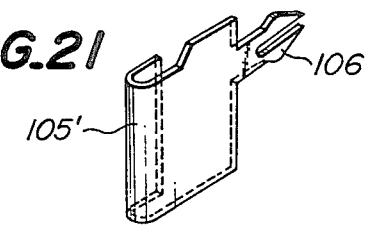

IC CARD AND CONNECTOR THEREFOR

BACKGROUND OF THE INVENTION

This invention relates to an IC card for use in electronic computers and other devices of this kind, particularly a shuttered card-edge type IC card and a connector for connecting the card.

An IC card has been used for supplying informations to be inputted into or writing informations to be outputted from electronic computers, particularly console units thereof or small electronic computers into which the IC card is inserted. In handling the IC card, there is a risk of memorized informations being broken down if a user's hand touches a connecting terminal portion of the card.

In order to avoid such an accident, an IC card as shown in FIG. 1 has been widely used. This IC card has a memory portion coated with a coating 112 of a synthetic resin or the like except a connecting terminal portion 111. Moreover, the IC card is provided with a movable shutter 113 between the connecting terminal portion 111 and the coating 112 for covering the terminal portion 111.

With this arrangement, when this IC card is inserted a connector provided in an electronic computer or the like, operating pawls 114 provided on both sides of the shutter 113 are pushed rearward so as to expose the connecting terminal portion to establish a connection between the card and the connector. When this card is drawn from the connector, the shutter 13 is automatically returned by an action of a spring 115 provided between the shutter 113 and the coating 112 to cover the connecting terminal portion 111. The IC card shown in FIG. 1 is a typical one of this kind, which has generally 80-90 mm length, 50-60 mm width and 1.5-2.5 mm thickness.

The shuttered IC card of the prior art as above described is superior in prevention of dust because of the shutter covering the terminal portion except when being used. Moreover, the shutter somewhat serves as an electrostatic shield. However, such a shuttered IC card encountered the following problems to be solved.

(1) As the operating pawls 114 extend outwardly, there is a risk of the pawls unintentionally brought into contact with another member when it is being used or carried to open the shutter 113, resulting in an unexpected accident.

(2) The terminal portion 3 is arranged on only one side of the IC card, so that it cannot provide for the increased number of terminals due to the improvement of integrated degree. Accordingly, this IC card does not fulfil the requirement of providing with terminals as many as possible. Such a requirement has become acuter with the increase in memory capacity of IC cards.

(3) The shutter 21 is electrically independent from a circuit in the IC card, so that the shutter 21 is not necessarily at the same potential as the ground of the circuit in the IC card. Therefore, if the shutter is charged with static electricity for any reason, it may discharge to the circuit in the card, so that the circuit is often damaged.

(4) The IC card and the connector are electrically independent from each other before being connected, so that grounds of the connector and IC card are not necessarily at the same potential. In the event that they are at different potential, when the IC card is inserted into the connector, electromagnetic troubles often occur in either or both the IC card and electronic equipment on the side of the connector.

SUMMARY OF THE INVENTION

It is a primary object of the invention to provide an IC card and a connector for connecting the IC card whose shutter is not easily opened even if any member contacts the card in carrying or using it and whose terminals are securely in contact with contacts of the connector when the card is inserted into the connector of an electronic computer.

It is another object of the invention to provide an IC card whose number of terminals has been increased to the maximum possible number, maintaining the advantages of the IC cards of the prior art.

It is a further object of the invention to provide a shuttered IC card having a shutter adapted to provide for electrostatic trouble.

It is an object of the invention to provide a connector which does not cause any electromagnetic trouble even if a ground of an IC card is at a potential different from that of a ground on a side of the connector.

In order to achieve these objects, in a shuttered card-edge type IC card including a base having springs therein and a circuit board, a shutter and a cover provided in succession on at least one surface of the base, according to the invention the base is formed with guide grooves and guide and spring receiving grooves and the springs for closing the shutter are located in the guide and spring receiving grooves, and the shutter is provided with pawls to be fitted in the guide grooves, respectively, for guiding the pawls in the guide grooves and the shutter is further provided with spring bias plates to be fitted in the guide and spring receiving grooves, respectively, for guiding the spring bias plates in the guide and spring receiving grooves and biasing the spring bias plates by the springs located therein.

According to the invention, the shutter is closed by compressive reaction force of the springs received in the base of the card, and opened by ridges provided in a connector into which the card is inserted.

In a preferred embodiment of the invention, the guide grooves for guiding the pawls for opening the shutter is provided on the opposite side of terminals with respect to the base so that a surface on the side of the terminals is used only for providing terminals.

In another embodiment, the terminals and shutters are provided on both surfaces of the base and the two shutters are connected so as to be operated simultaneously.

According to the invention, the shutter and the ground of the internal circuit are electrically conductive through the springs for closing the shutter.

The connector according to the invention comprises an insulating block provided therein with ridges made of a conductive material corresponding in position and dimension to I-shaped grooves formed in the base of the IC card, and the ridges and the ground of an electronic equipment on a side of the connector are electrically connected.

The invention will be more fully understood by referring to the following detailed specification and claims taken in connection with the appended drawings.

BRIEF DESCRIPTION OF THE DRAWINGS

FIG. 2 is an exploded perspective view illustrating an IC card according to the invention;

FIG. 3 is a perspective view showing the shutter shown in FIG. 2;

FIG. 4 is a perspective bottom view illustrating the base shown in FIG. 2;

FIG. 5 is a bottom plan view of the base shown in FIG. 4;

FIGS. 6a, 6b and 6c are partial sectional views taken along lines VIa—VIa, VIb—VIb and VIc—VIc;

FIG. 7 is an explanatory view illustrating how to locate springs in spring receiving grooves formed in the base of the IC card according to the invention;

FIGS. 8 and 9 are explanatory views illustrating how to secure the shutter to the base according to the invention;

FIGS. 10a and 10b are views for explaining the spring and its function used in the invention;

FIG. 11a is a perspective view of another embodiment of the IC card according to the invention;

FIG. 11b is an exploded perspective view of the IC card shown in FIG. 11a;

FIG. 12a is a partial sectional view for explaining how to secure the shutter to the card shown in FIG. 11a;

FIG. 12b is a perspective view of the shutter shown in FIG. 12a;

FIGS. 13a and 13b and FIG. 14 illustrate further embodiments of the shutter used in the IC card according to the invention;

FIGS. 16a, 16b, 16c and 16d are perspective views illustrating embodiments of the shutter used in the IC card according to the invention;

FIGS. 17a, 17b-1, 17b-2, 17c and 17d illustrate how to make conductive between the shutter and the ground of the internal circuit used in the invention;

FIG. 18a is a front view illustrating a connector for the IC card according to the invention;

FIG. 18b is a plan view of the connector shown in FIG. 18a;

FIG. 18c is a sectional view taken along a line XVIIIc—XVIIIc in FIG. 18a;

FIGS. 19a, 19b and 19c are views similar to FIGS. 18a, 18b and 18c illustrating another embodiment of the connector according to the invention;

FIGS. 20a, 20b and 20c are views similar to FIGS. 18a, 18b and 18c illustrating a further embodiment of the connector according to the invention; and FIG. 21 is a perspective view illustrating the ridge to be formed in the connector according to the invention.

DESCRIPTION OF THE PREFERRED EMBODIMENTS

Figure 1:
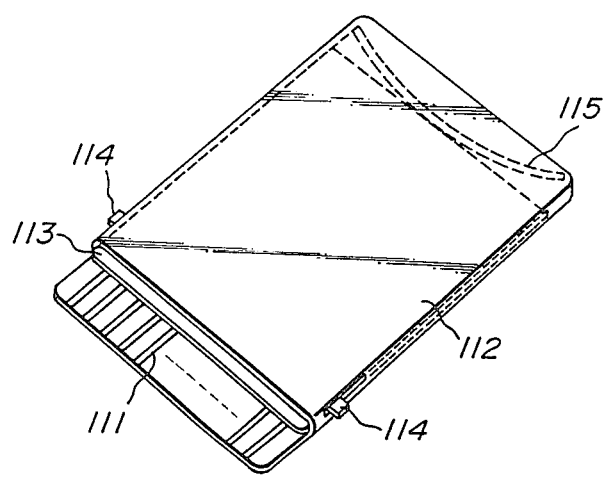
FIG. 1 is a perspective view illustrating a shuttered card-edge type IC card of the prior art.

The IC card according to the invention comprises in outline a base A having springs E provided therein, and a circuit board B, a shutter C and a cover D arranged in succession on at least one surface of the base A.

FIG. 2 illustrates one embodiment of the IC card according to the invention showing principal parts constituting the card and the relations therebetween.

In FIG. 2, the IC card comprises a base, a circuit board provided thereon with for example an integrated circuit, and a shutter C covering a terminal portion 3 of the circuit board B and provided between the circuit board and an upper surface cover D. The upper surface cover D covers the circuit board B except its terminal portion 3 and the shutter plate C. The IC card further comprises springs E located in spring receiving grooves 33 formed in a bottom surface of the base A and a bottom cover F for the base A. The principal parts of the IC card shown in FIG. 2 will be explained in detail hereinafter.

The base A is formed in its upper surface with shutter guide grooves 31 (referred to hereinafter "I-shaped grooves") for guiding pawls 21 of the shutter C and with guide grooves 32 (referred to hereinafter "T-shaped grooves") for guiding pawls 22 having spring bias plates 23 of the shutter C. The T-shaped grooves 32 communicate with the spring receiving grooves 33 formed in the bottom surface of the base A as later explained referring to FIGS. 4–7.

The I-shaped grooves 31, extend halfway in their depth directions over a thickness of the base A without extending through the base A. Although there is no limited condition for the I-shaped grooves 31 other then their depth, they are so designed as to be able to guide the pawls 21 in response to a movement of the shutter C. In general, a depth of 0.5 mm of the grooves suffices to ensure their performance. By determining the depth of the I-shaped grooves in this manner, it is possible to distinguish one surface of the card from the other surface clearly to prevent an erroneous insertion of the card into the connector.

Moreover, the base A of the IC card according to the invention is usually provided a frame 35 for settling the circuit board B or the like thereon as shown in FIG. 2. The circuit board B to be arranged on the base A often includes an IC chip 1, a battery (not shown), switches (not shown) and others having thicknesses. In this case, the base A is formed with a recess 34 corresponding to these parts for receiving them.

FIG. 4 is a perspective view illustrating the base A turned upside down. As shown in FIG. 4, the base A is formed in its bottom surface with the spring receiving grooves 33 capable of receiving the springs E having their free lengths.

FIG. 5 is a bottom plan view of the base A and FIGS. 6a, 6b and 6c are sectional view taken along lines VIa—VIa, VIb—VIb and VIc—VIc in FIG. 5. As can be seen from these drawings, the T-shaped grooves 32 on the upper surface of the base A are shorter than the spring receiving grooves 33 provided in the bottom surface of the base A.

FIG. 7 illustrates the spring E received in the spring receiving groove 33. As the spring receiving grooves 33 have lengths equal to or longer than the free lengths of the spring E, these springs E are easily located in the spring receiving grooves 33. After the springs E are arranged in the grooves 33, the grooves 33 are covered by the bottom cover F. The bottom cover F is not necessarily a cover covering all over the bottom surface of the base A so long as the cover F is capable of preventing the springs E from jumping out of the spring receiving grooves 33. A material, a thickness and the like of the bottom cover F are preferably selected in the same manner as in the shutter C without particular requirements. In general, the bottom cover F is preferably made of a stainless steel plate.

Moreover, the base A is preferably or the like without any limitation. In consideration of its configuration, weight, workability, durability, cost and the like, materials for the base A are resins and as polyethylene, polypropylene, polyvinyl chloride, polystyrene, polyamide, polycarbonate, polyester, polyphenylene oxide, polyphenylene sulfide, fluorine plastic material and the like or copolymers of these plastic materials, mixed resins and the like. Among these materials, polyethylene, polypropylene, polyvinyl chloride, polyamide, polyester and the like and copolymers thereof are widely used for the base A.

Any circuit boards of generally known IC cards can be used as the circuit board B for the IC card according to the invention. Although the circuit board B has been shown in FIG. 2 devoid of the portion corresponding to the I-shaped grooves 31 and T-shaped grooves 32, any configuration of the circuit board B other than that shown may be employed so long as it does not interfere with the movement of the pawls 21 and 22 of the shutter C. This is only a problem in designing the circuit board. FIG. 2 exemplarily illustrates the IC provided on the circuit board B, terminals 2 of the IC, terminals 3 of the circuit board B, and a wiring 4 of the circuit. Moreover, a circuit of an IC card may be formed directly on the base A. In this case, the independent circuit board can be dispensed with.

FIG. 3 is a perspective view illustrating the shutter C shown in FIG. 2 turned upside down. The shutter C is provided with pawls 21 and 22 for guiding the movement of the shutter C. The pawls 21 and 22 arranged one on forward and rearward sides suffice to perform their functions. If more smooth movement of the shutter is required, two or more pawls 21 and 22 are preferably provided one on the forward and rearward sides. By arranging, for example, two pawls 21 and two pawls 22 spaced apart by sufficient distances, the shutter C is moved only when these pawls are subjected to substantially uniform forces but not moved upon being subjected to unequal forces. This effect is preferable in inserting the card into a connector.

According to the invention, the pawls 22 on the front side in an opening direction of the shutter are provided at their ends with the spring bias plates 23. The spring bias plate 23 compress the spring E when the shutter is opened, and is subjected to a compressive reaction force of the spring when the shutter is closed. This compressive reaction force serves to close the shutter. The shutter moves on the circuit board B. For the purpose of protecting the circuit board B and making smooth the movement of the shutter, the shutter may be provided on a side of the circuit board with a coating film. In consideration of wear-resistant, lubricating and insulating properties, a material for the coating film is used such as polytetrafluoroethylene, polyamide, polyester, crosslinked polyethylene, polyphenylene oxide, polysulfone, polyphenylene sulfide, and the like.

A material of the shutter C is not particularly limited. In consideration of thinness, robustness, durability and the like required as a shutter, a metal, particularly a stainless steel is preferable.

FIGS. 8 and 9 are drawings for explaining how to mount the shutter C after the circuit board B has been provided on the base A. FIG. 8 particularly shows the spring E with its free length received in the spring receiving grooves 33 formed in the bottom surface of the base A as viewed from the T-shaped groove 32 in the upper surface of the base A. In this case, a jig 81 in the form of a bar is inserted through the T-shaped groove into the spring E. Thereafter, the jig 81 is moved as shown in FIG. 9, so that the spring E is compressed until an end 61 of the spring E arrives at a narrow portion 32b of the groove 32 after it has passed a wide portion 32a of the groove 32. Then the pawls 22 having spring bias plates 23 and the pawls 21 of the shutter C are into the wide portion 32a of the T-shaped grooves 32 and the I-shaped grooves 31, respectively to secure the shutter on the base A.

Moreover, the upper cover D is secured to the shutter C. A material of the upper cover D is selected in the same manner in the shutter C and the bottom cover F.

The springs E for closing the shutter C of the IC card according to the invention may be any elongated compression springs. However, coil springs formed by winding spring steel wires about axes and leaf springs formed by zigzag bending band-like spring steel. From the view-points of durability, facility in handling, cost and the like, the coil springs are more preferable.

The shutter C of the IC card according to the invention is moved by the action of the springs, which will be explained in detail. FIGS. 10a and 10b are drawings for explaining the relation between compressive deformations and functions of the spring E used in the invention. Referring to FIG. 10a, the free length is a length of the spring not subjected to any compressive force, and I indicates a pre-compressive deformation which the spring exhibits when the shutter is completely closed and II indicates a deformation of the spring between the completely closed position and the fully opened position of the shutter. When the shutter is completely closed, it is subjected to the compressive force corresponding to the pre-compressive deformation. When the shutter is fully opened, it is subjected to the compressive force corresponding to the pre-compressive deformation I plus the deformation II. FIG. 10b illustrates a relation between the compressive reaction force and the deformation of the spring shown in FIG. 10a. In FIG. 10a, for example, the pre-compressive force in the spring at the pre-compressive deformation corresponds to a force acting upon the completely closed shutter. It is understood that the shutter would not open unless any more force effectively acts upon the shutter.

With the card explained referring to FIGS. 2–10b, the grooves 31 for guiding the jaws of the shutter C are provided in the same surface as that on which the terminals are arranged, so that the area in which the terminals are arranged becomes narrower by the area occupied by the grooves 31. As shown in FIGS. 11a and 11b, however, if grooves 31 are formed in a surface of the base A opposite to a surface on which a circuit board B is located, the memory capacity of the IC card increases to provide for the requirement to have terminals as many as possible.

FIG. 11a perspectively illustrates another IC card according to the invention. FIG. 11b is an exploded perspective view of the IC card shown in FIG. 11a.

As shown in FIGS. 11a and 11b, the base A is formed in a bottom surface with the grooves 31 for guiding the pawls 21 of the shutter C. Moreover, the shutter C is provided with the pawls 21 corresponding to the pawls 21 of the base A.

FIG. 12a illustrates how to secure the shutter C to the board B and base A. FIG. 12b shows a configuration of the shutter secured to the board B and base A. As shown in FIGS. 12a, pawls 21, connecting portions 24 and spring bias plates 23 are formed in L-shaped members. These L-shaped members are passed through the spring receiving grooves 32 from upper surface to bottom surface of the base A so that the shutter C is arranged on the circuit board B provided on the base A. Thereafter, the connecting portions 24 and the pawls 21 are bent toward the shutter C into the form of a hair pin shown in two-dot-and-dash lines in FIG. 12a. In this manner, the shutter C is formed into the shape shown in FIG. 2b and the pawls 21 and the connecting portions are received in the grooves 31 in the bottom surface of the base A.

The shutter C of the IC card according to the invention is only required to have the configuration as shown in FIG. 12b. It may be made by any method other than that above described. For example, it may be that shown in FIGS. 13a and 13b. As shown in FIG. 13a, a shutter C provided with spring bias plates 23 is jointed by welding to separately made members consisting of pawls 21, connecting portions 24 and jointing portions 23′. In this case, the spring bias plates 23 and the jointing portions 23′ are connected by welding.

Figure 14:
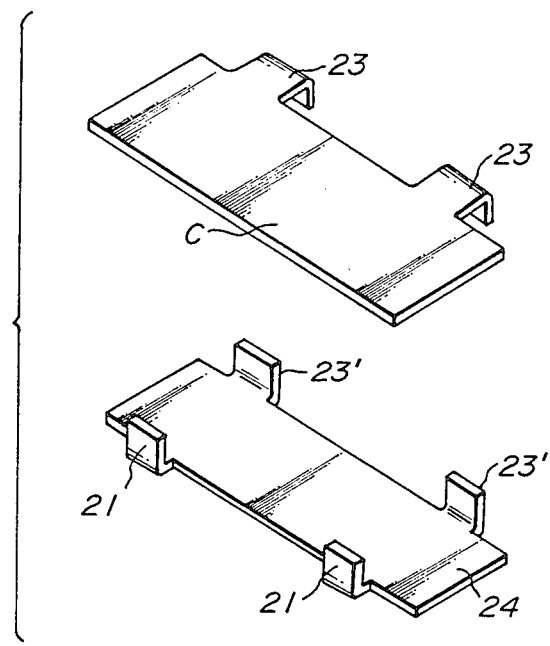

FIG. 14 illustrates another modification of the shutter C, wherein a shutter C provided with spring bias plates 23 is connected by welding to a separately made member consisting of a connecting portion 24 provided with pawls 21 and jointing portions 23′. In this case, the spring bias plates 23 and the jointing portions 23′ are connected by welding.

The IC cards according to the invention shown in FIG. 2 and FIGS. 11a and 11b are provided with the terminals only on one surfaces of the cards, so that they do not sufficiently provide for the requirement to increase the terminals as many as possible. In order to fulfil such a requirement, terminals are provided on both surfaces of the card.

Figure 15:
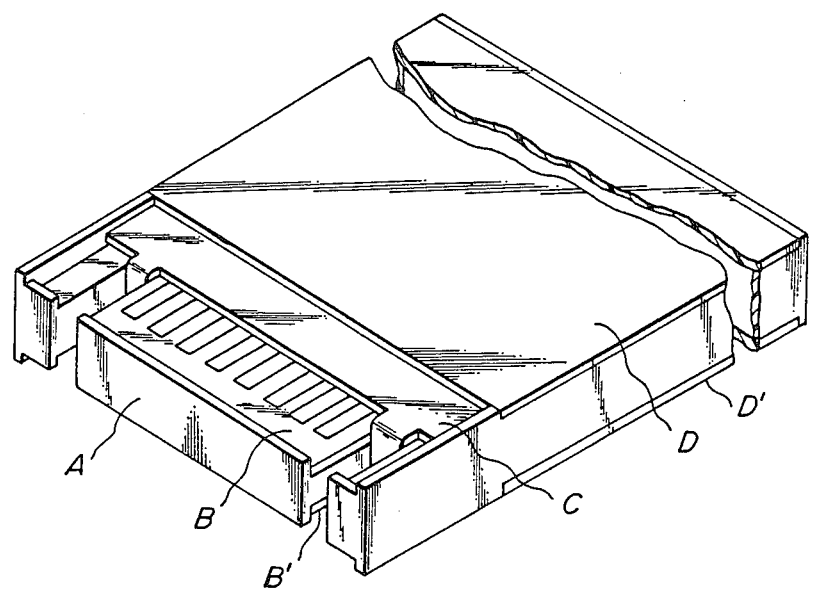
FIG. 15 is a perspective view illustrating a modification of the IC card according to the invention provided with terminals on both surfaces.

FIG. 15 is a perspective view illustrating an IC card having terminals on both the surfaces of the card. The IC card comprises on a bottom side a circuit board B′, a shutter C′ (not shown) and a cover D′ successively provided corresponding to those on an upper side.

FIGS. 16a-16d illustrate various modifications of the shutter used in the IC card according to the invention. For the reason that the shutters C and C′ provided on the upper and lower surfaces of the base A are simultaneously closed and opened, and for the other reasons, these shutters C and C′ are connected with each other. Any connecting methods may be employed for this purpose, which are shown in FIGS. 16a-16d.

In FIG. 16a, two shutters C and C′ are connected to form a rectangular cylinder having pawls 21 and 21′ integrally connected. In this case, the base A is provided on both sides with grooves 36 for enabling the connecting portions 24 of the shutters C and C′ to move therealong.

FIG. 16b illustrates two shutters C and C′ connected into a U-shaped member to overlap pawls 21 of the respective shutters C and C′. In this case, one edge of the base A is cut off to form grooves 36 for permitting connecting portion 24 of the shutters C and C′ to move therealong. Covers D and D′ covering the outermost surfaces of the IC card are connected into an integral U-shaped cover.

FIG. 16c illustrates two separately made upper and lower shutters C and C′ connected by pawls 21 and 21′ to form a unitary body.

FIG. 16d shows two shutters C and C′ connected into a U-shaped member. However, either of the overlapped pawls 21 of the shutters C and C′ is dispensed with. In this case, grooves 31 may be provided one in each surface of the base A.

According to the invention, the guide grooves 31 provided in the base A for the shutters C and C′ are more than two, and shapes and sectional shapes of the guide grooves 31 are made different from each other or they are provided in asymmetry, thereby enabling both surfaces of the IC card to be distinguishable.

In the IC card according to the invention, electrostatic trouble can be prevented by electrically connecting the ground of the circuit board B and the shutter C in the card.

Any system may be employed, so long as the ground of the internal circuit and the shutter become conductive. Embodiments for this purpose will be explained by referring to FIGS. 17a-17d.

In FIG. 17a, a spring E to be located in a T-shaped groove 32 has one end abutting against a spring bias pawl 23 of a shutter C and the other end 11 which is substantially straight extended and formed with a curved portion. The curved portion of the end 11 of the spring is inserted between the base A and the circuit board B so as to be connected with the ground of the circuit board B. As the one end of the spring E located in the T-shaped groove 32 is in contact with the spring bias pawl 23, the ground of the circuit board B and the shutter C become conductive through the spring E.

In FIG. 17b-1, between a T-shaped groove 32 formed in a base A and a spring E is interposed a contact member 12 having one end abutting against one end of the spring E and the other end 13 adapted to be connected to a ground of the circuit board B.

One example of the contact member 12 being secured to the base A is shown in FIG. 17b-2, wherein the contact member is pivotally connected to the base A with the aid of projections integrally formed in the contact member 12 to obtain a stable connection.

In FIG. 17C, a contact 14 connected to the ground of the circuit board B is planted in the circuit board B and interposed between the T-shaped groove 32 of the base A and the spring E. In this manner, the shutter C and the ground of the circuit board B become conductive through the spring E.

In FIG. 17d, the circuit board B is provided in the proximity of the T-shaped groove 32 with a suitably sized ground terminal contact 15 which is bent into the T-shaped groove 32 so as to bring the contact 15 into contact with the spring E to obtain an electrical connection between the shutter C and the ground of the circuit board B.

Most preferable connectors for the IC cards according to the invention are shown in FIGS. 18a-20c. Particularly, the connector shown in FIGS. 18a-18c is used for the IC card shown in FIG. 2, the connector shown in FIGS. 19a-19c for the IC card having the terminals on both the surfaces shown in FIG. 15 and the connector shown in FIGS. 20a-20c for the IC card shown in FIGS. 17a-17d providing for the electrostatic trouble.

In FIGS. 18a-20c, each an insulating block 101 has contacts 102 planted therein and is formed with guide legs 103 formed with guide grooves 104. The guide legs 103 are not essential for constituting the invention but serve to bring about more effective results. The insulating block 101 is formed inside with ridges 105 having positions and dimensions capable of fitting in the I-shaped grooves 31 provided in the base A of the IC card according to the invention to be inserted into the insulating block 101 with the aid of the guidance of the guide legs 103.

The ridges 105′ provided in the insulating block 101 shown in FIGS. 20a-20c are made of a conductive material. Its one example is shown in FIG. 21. The ridge 105′ shown in FIG. 21 is obtained by stamping or punching a metal plate of copper, copper alloy or the like as used for contacts of connectors into a predetermined shape and further applying to the punched metal plate a suitable working such as pressing. The conductive ridges 105' may be formed from a conductive synthetic resin. Reference numeral 106 denotes a terminal to be connected to a ground of an electronic equipment on the side of the connector.

When the IC card according to the invention is being inserted into the connector along the guide grooves 104 in the guide legs 103, the pawls 21 of the shutter C of the IC card are raised by the ridges 105 provided in the insulating block 101 of the connector so as to expose the terminals 3 of the circuit board B of the IC card, thereby bringing the terminals 3 into contact with the contacts 102 of the insulating block 101 of the connector. On the other hand, when the IC card inserted in the insulating block 101 of the connector is drawn out of the insulating block 101, the shutter C of the IC card covers the terminals of the IC card in its completely closed position with the aid of the compressive reaction force of the springs arranged in the base A of the IC card. As can be seen from this explanation, the ridges 105 formed in the insulating block 101 and the I-shaped grooves 31 provided in the base A of the IC card are in a relation as if the ridges 105 and the I-shaped grooves were a "key" and a "lock", so that a wrong insertion of the IC card turned upside down is prevented even in a dark location.

The operation of the IC card in the case of the ridges 105 in the insulating block being the conductive ridges 105' will be explained. When the shuttered IC card is being inserted into the connector along the guide grooves 104 of the guide legs 103, the shutter pawls 21 of the IC card are brought into contact with the conductive ridges 105' in the insulating block 101 of the connector so that the shutter C and the ridges 105' of the connector become conductive before the shutter is opened. Upon further insertion of the IC card into the connector, the pawls 21 of the shutter C of the IC card are raised by the conductive ridges 105' to expose the terminals 3 of the circuit board B of the IC card so as to bring the terminals 3 into contact with the contacts 102 planted in the insulating block 101 of the connector. Furthermore, when the IC card is drawn out of the insulating block 101 of the connector, the shutter C of the IC card covers in its fully opened condition the exposed portion of the IC card with the aid of the compressive reaction force of the springs located in the base A of the IC card.

Namely, when the shuttered IC card for providing for the electrostatic trouble as shown in FIGS. 17a-17d is inserted into the connector shown in FIGS. 20a-20c, the shutter C of the IC card and the conductive ridges 105' of the connector become conductive before the terminals 3 of the IC card is brought into contact with the contacts 103 of the connector. When the IC card is drawn out of the connector, the terminals of the IC card are out of contact with the contacts of the connector and are covered by the shutter and thereafter the shutter C leaves away from the conductive ridges of the connector.

The IC card and the connector therefor constructed as above described have the following various significant effects which are brought about only by the invention.

(1) The IC card according to the invention is devoid of projections outwardly provided for closing and opening a shutter, so that inadvertent opening of the shutter is prevented. There is no risk of erroneous operation of the card caused by the inadvertent opening of the shutter. The reliability of the card is high.

(2) The closed shutter is kept by the precompressive force of the springs. It does not open by a weak force and tight closing of the shutter is ensured. For example, therefore, even if the IC card is carried with a user in his pocket for a long period of time, contamination of the card suffering from dust is prevented as possible.

(3) The springs used in the card are compression coil springs which exhibit less fatigue in repeated use to improve the reliability of the card.

(4) The two I-shaped grooves spaced from each other are arranged one on each side of the base of the card. The IC card is prevented from inserting into the connector unless the IC card is pressed by substantially equal forces acting upon both the sides simultaneously. Therefore, the reliability on correct insertion of the card into the connector is improved and correct connecting between the card and the connector is ensured.

(5) The I-shaped grooves in the base of the card have the depths which do not pass through the base. Therefore, the upper and lower surfaces of the IC card are clearly distinguishable from each other. Moreover, the connector is provided with opposed ridges to prevent the wrong insertion of the card turned upside down into the connector and to ensure the correct insertion of the card with the aid of the guidance of the ridges.

(6) The guide grooves are provided in the back surface of the base A of the card to enable the terminals 3 to be arranged on overall width of the IC card, so that the memory capacity of the card is increased to fulfil the requirement in the field of the industry to provide terminals as many as possible.

(7) Terminal portions are provided on both the surfaces of the IC card to increase twice the number of the terminal.

(8) The two shutters provided on both the surfaces of the base A of the card are connected to each other. These two shutters are securely simultaneously closed and opened when required, the reliability of the shutter in closing and opening is improved.

(9) A plurality of the guide grooves 31 and the T-shaped guide grooves 32 for guiding the shutter are provided to ensure smooth closing and opening of the shutter.

(10) By modifying the sectional shapes of the guide grooves 31 for by arranging the guide grooves 31 in asymmetry, the upper and lower surfaces of the IC card are distinguishable from each other. Moreover, the connector is provided with ridges corresponding to the guide grooves 31 to prevent the IC card from being erroneously inserted into the connector.

(11) The shutter and the ground of the internal circuit of the IC card are kept at substantially the same potential so that any electrostatic trouble between the shutter and the internal circuit is eliminated.

(12) It is possible to maintain the shutter of the IC card and electronic equipment on the side of the connector at substantially the same potential. Therefore, so long as the internal circuit and the shutter in the IC card are electrically connected, the internal circuit of the IC card and the electronic equipment on the side of the connector are electrically connected to eliminate any electromagnetic trouble such as the electrostatic trouble therebetween.

While the invention has been particularly shown and described with reference to preferred embodiments thereof, it will be understood by those skilled in the art that the foregoing and other changes in from and details can be made therein without departing from the spirit and scope of the invention.

What is claimed is:

1. A shuttered card-edge type IC card including a base having springs therein and a circuit board, a shutter and a cover provided in succession on at least one surface of the base, wherein said base is formed with guide grooves and guide and spring receiving grooves and said springs for closing said shutter are located in said guide and spring receiving grooves, and wherein said shutter is provided with pawls to be fitted in the guide grooves, respectively, for guiding said pawls in the guide grooves and said shutter is further provided with spring bias plates to be fitted in the guide and spring receiving grooves, respectively, for guiding said spring bias plates in the guide and spring receiving grooves and biasing said spring bias plates by said springs located therein.

2. A shuttered card-edge type IC card as set forth in claim 1, wherein each said guide and spring receiving groove is partially closed on a side of said circuit board and a remaining opened portion of the groove is narrowed in width except a part of the remaining opened portion to form a T-shaped guide groove.

3. A shuttered card-edge type IC card as set forth in claim 1, wherein a depth of each said guide groove is less than a thickness of the base.

4. A shuttered card-edge type IC card as set forth in claim 1, wherein said springs are long springs selected from coil springs and leaf springs made of band-like spring steels being bent zigzag.

5. A shuttered card-edge type IC card as set forth in claim 1, wherein said pawls of the shutter and said guide grooves formed in said base are located on an opposite side of said circuit board with respect to said base.

6. A shuttered card-edge type IC card as set forth in claim 1, wherein said card further comprises a circuit board, a shutter covering terminals of said circuit board, and a cover provided in succession on the other surface of said base, and said shutters on both sides of said base are connected to each other to close and open these shutters simultaneously.

7. A shuttered card-edge type IC card as set forth in claim 6, wherein said shutter provided on the other side of the base is provided with pawls, and said shutters are connected at said pawls.

8. A shuttered card-edge type IC card as set forth in claim 6, wherein said shutteres are made of plates in a shape selected from a U-shaped configuration and a cylindrical configuration rectangular in section.

9. A shuttered card-edge type IC card as set forth in claim 6, wherein one of said circuit boards consists only of a terminal portion.

10. A shuttered card-edge type IC card as set forth in claim 6, wherein a circuit is directly provided on at least one surface of said base.

11. A shuttered card-edge type IC card as set forth in any one of the preceding claims 1-10, wherein said shutter and a ground of an internal circuit of the circuit board are made conductive by connecting said shutter and the ground through said springs.

12. A connector for an IC card, said IC card including a base having springs therein and a circuit board, a shutter and a cover provided in succession on at least one surface of the base, said base being formed with guide grooves and guide and spring receiving grooves and said springs for closing said shutter being located in said guide and spring receiving grooves, and said shutter being provided with pawls to be fitted in the guide grooves, respectively, for guiding said pawls in the guide grooves and said shutter being further provided with spring bias plates to be fitted in the guide and spring receiving grooves, respectively, for guiding said spring bias plates in the guide and spring receiving grooves and biasing said spring bias plates by said springs located therein, wherein said connector comprises ridges located corresponding to said guide grooves of said base of the card and to be fitted in said guide grooves.

13. A connector as set forth in claim 12, wherein said ridges are made of a conductive material.

* * * * *